(12) United States Patent  (10) Patent No.: US 8,860,862 B2
Kobayashi et al.  (45) Date of Patent: Oct. 14, 2014

(54) SOLID-STATE IMAGE PICKUP APPARATUS, AND IMAGE PICKUP SYSTEM USING SOLID-STATE IMAGE PICKUP APPARATUS

(75) Inventors: Masahiro Kobayashi, Tokyo (JP); Yuichiro Yamashita, Ebina (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 13/473,442

(22) Filed: May 16, 2012

(65) Prior Publication Data

US 2012/0300106 A1    Nov. 29, 2012

(30) Foreign Application Priority Data

May 27, 2011  (JP) ................................. 2011-119258

(51) Int. Cl.
  *H04N 3/14* (2006.01)
  *H04N 9/04* (2006.01)
  *H01L 27/146* (2006.01)

(52) U.S. Cl.
  CPC .... *H01L 27/14623* (2013.01); *H01L 27/14609* (2013.01); *H01L 27/14603* (2013.01)
  USPC ......................................... 348/308; 348/294

(58) Field of Classification Search
  USPC ......................................... 348/294, 302–308
  See application file for complete search history.

(56) References Cited

U.S. PATENT DOCUMENTS

| 8,648,939 | B2 | 2/2014 | Okuno | |
| 2007/0102781 | A1* | 5/2007 | Ladd | 257/462 |
| 2009/0050945 | A1* | 2/2009 | Inoue | 257/292 |
| 2010/0330723 | A1 | 12/2010 | Okabe et al. | |
| 2011/0074969 | A1* | 3/2011 | Takeda | 348/222.1 |
| 2011/0242390 | A1 | 10/2011 | Sogoh et al. | |

FOREIGN PATENT DOCUMENTS

| JP | 10-070261 A | 3/1998 |
| JP | 2008-004692 A | 1/2008 |
| JP | 2008-543061 A | 11/2008 |
| JP | 2011-029835 A | 2/2011 |

* cited by examiner

*Primary Examiner* — Gevell Selby
(74) *Attorney, Agent, or Firm* — Canon USA, Inc. IP Division

(57) ABSTRACT

A solid-state image pickup apparatus includes a photoelectric conversion unit, a charge storage unit, and a floating diffusion unit, all disposed on a semiconductor substrate. The solid-state image pickup apparatus further includes a first gate electrode disposed on the semiconductor substrate and extending between the photoelectric conversion unit and charge storage unit, and a second gate electrode disposed on the semiconductor substrate and extending between the charge storage unit and the floating diffusion unit. The solid-state image pickup apparatus further includes a light shielding member including a first part and a second part, wherein the first part is disposed over the charge storage unit and at least over the first gate electrode or the second gate electrode, and the second part is disposed between the first gate electrode and the second gate electrode such that the second part extends from the first part toward a surface of the semiconductor substrate.

17 Claims, 6 Drawing Sheets

SOLID-STATE IMAGE PICKUP APPARATUS, AND IMAGE PICKUP SYSTEM USING SOLID-STATE IMAGE PICKUP APPARATUS

BACKGROUND OF THE INVENTION

1. Field of the Invention

One disclosed aspect of the embodiments relates to a solid-state image pickup apparatus and an image pickup system using a solid-state image pickup apparatus, and more particularly, to a light shielding member of a solid-state image pickup apparatus having a charge storage unit disposed in each pixel.

2. Description of the Related Art

In an active pixel-type solid-state image pickup apparatus typified by a CMOS image sensor, it has been proposed to provide a global electronic shutter function.

The global electronic shutter function refers to a function of performing accumulation of a photo charge in a plurality of pixels arranged in a matrix such that the accumulation of the photo charge is started and ended simultaneously for all pixels. In the solid-state image pickup apparatus having the global electronic shutter function, each pixel includes a photoelectric conversion unit and a charge storage unit configured to store the charge generated via the photoelectric conversion for a particular period. In the charge storage unit of the solid-state image pickup apparatus having the global electronic shutter function, the charge is stored over a period from the end of the accumulation of the photo charge to the start of reading the charge. During this period, if an electric charge generated elsewhere other than the photoelectric conversion unit intrudes into the charge storage unit, noise occurs which may result in degradation in image quality. Japanese Patent Laid-Open No. 2008-004692 discloses a structure in which each pixel includes a photoelectric conversion unit and a charge storage unit, and a light shielding member is disposed over the charge storage unit.

In the structure disclosed in Japanese Patent Laid-Open No. 2008-004692, the light shielding member is disposed on an interlayer insulating film including a wiring layer. In this structure, oblique light may easily intrude into the charge storage unit via an opening of the light shielding member. In a case where a contact is disposed for use in supplying a voltage to an element, it is necessary that an opening for a plug of the contact is formed in the light shielding member. This makes it easier for oblique light to intrude into the charge storage unit. If the electric charge produced by such oblique light is mixed with an image charge stored in the charge storage unit, degradation in image quality occurs.

In view of the above, embodiments provide a solid-state image pickup apparatus having a charge storage unit with an improved light shielding performance, and an image pickup system using such a solid-state image pickup apparatus.

SUMMARY OF THE INVENTION

According to an aspect of the embodiments, a solid-state image pickup apparatus includes a semiconductor substrate, a photoelectric conversion unit disposed on the semiconductor substrate, a charge storage unit that is disposed on the semiconductor substrate and that stores an electric charge generated in the photoelectric conversion unit, a floating diffusion unit which is disposed on the semiconductor substrate and to which the electric charge stored in the charge storage unit is transferred, a first gate electrode disposed on the semiconductor substrate such that the first gate electrode extends between the photoelectric conversion unit and the charge storage unit and such that the first gate electrode reaches the charge storage unit, a second gate electrode disposed on the semiconductor substrate such that the second gate electrode extends between the charge storage unit and the floating diffusion unit, and a light shielding member including a first part and a second part wherein the first part is disposed over the charge storage unit and at least over the first gate electrode and the second gate electrode, and wherein the second part is disposed between the first gate electrode and the second gate electrode such that the second part extends from the first part toward a surface of the semiconductor substrate.

Further features of the disclosure will become apparent from the following description of exemplary embodiments with reference to the attached drawings.

DESCRIPTION OF THE EMBODIMENTS

According to an embodiment, a solid-state image pickup apparatus includes a photoelectric conversion unit, a charge storage unit, and a floating diffusion unit, which are all disposed on a semiconductor substrate. A first gate electrode is disposed between the photoelectric conversion unit and the charge storage unit on the semiconductor substrate, and a second gate electrode is disposed between the charge storage unit and the floating diffusion unit on the semiconductor substrate. This solid-state image pickup apparatus according to one embodiment also includes a light shielding member including a first part disposed over the charge storage unit and over at least either the first gate electrode or the second gate electrode. The light shielding member also includes a second part disposed between the first gate electrode and the second gate electrode and extending from the first part to a surface of the semiconductor substrate. This structure makes it possible to suppress incidence of oblique light onto the charge storage unit and thus improve the light shielding performance.

Hereinafter, the term "contact plug" is used to describe a plug formed of an electrically conductive material for connecting one member to another member. Furthermore, in the following description, directions are defined such that a downward direction is a direction from the surface of the semiconductor substrate toward the inside of the semiconductor substrate, and an upward direction is defined as the opposite direction.

First Embodiment

A solid-state image pickup apparatus according to a first embodiment is described below with reference to FIG. 1, FIG. 2A, FIG. 2B, FIG. 3A, and FIG. 3B.

Figure 1:
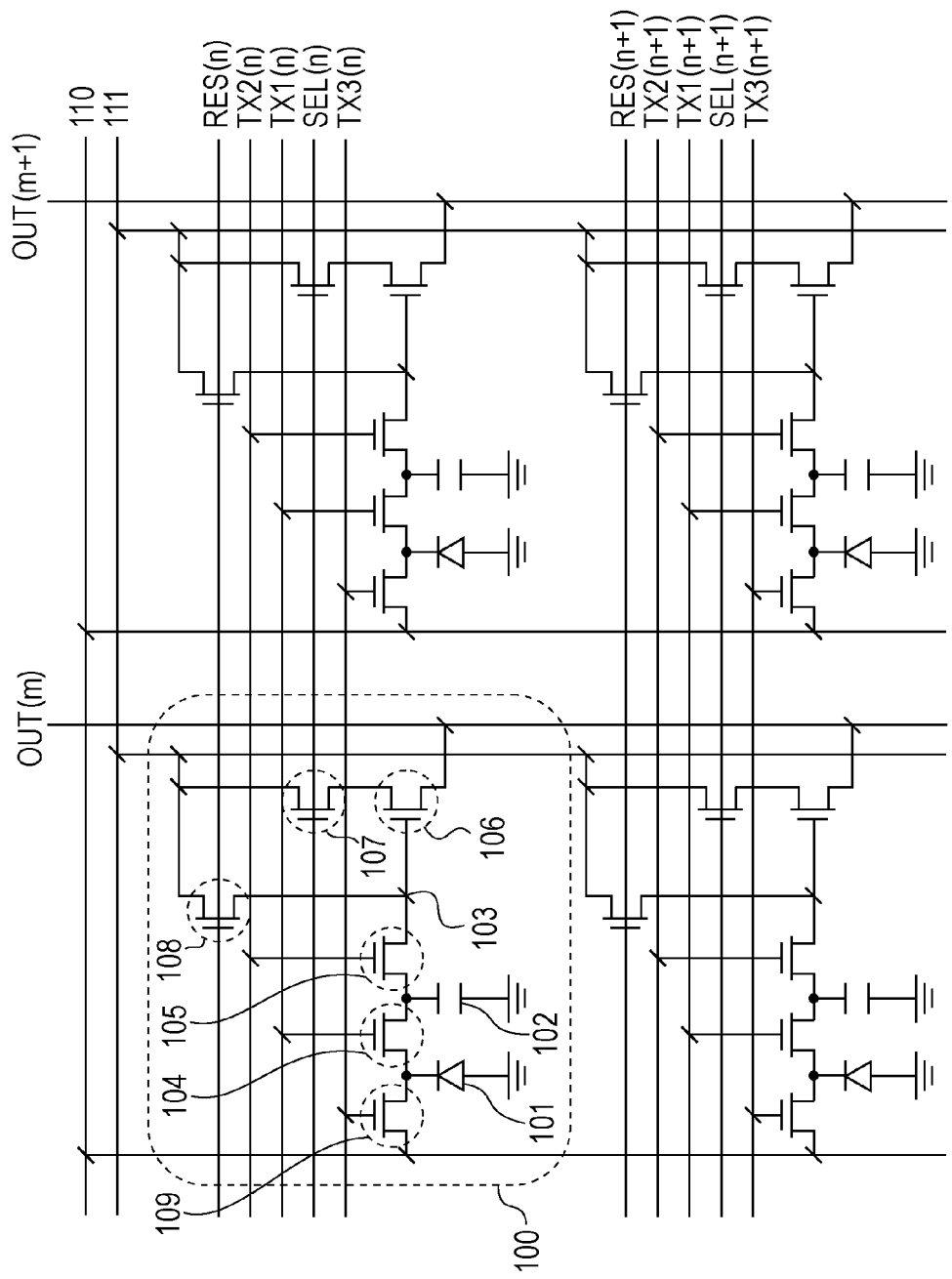
FIG. 1 is a circuit diagram of a solid-state image pickup apparatus according to a first embodiment.

FIG. 1 is a circuit diagram illustrating four pixels (extracted from a total number of pixels) of the solid-state image pickup apparatus according to the present embodiment. In FIG. 1, pixels 100 are arranged in an array with two rows and two columns. Each pixel 100 includes a photoelectric conversion unit 101, a charge storage unit 102, a first transfer transistor 104, a second transfer transistor 105, an amplifying transistor 106, a selection transistor 107, and a reset transistor 108. Each pixel 100 further includes a third transfer transistor 109 serving as an over flow drain (OFD) for discharging an unnecessary charge. In the pixel 100, reference numeral 103 denotes a node including a floating diffusion (FD) unit. A power supply line 110 and a power supply line 111 are wirings for supplying a voltage. The power supply line 110 is connected to a main electrode region of the OFD transistor 109. The power supply line 111 is connected to a main electrode region of the reset transistor 108 and a main electrode region of the selection transistor 107. RES, TX1, TX2, SEL, and TX3 denote control lines via which pulses are supplied to gate electrodes of the respective transistors from a vertical scanning circuit (not shown). More specifically, the control line RES is for supplying a pulse to the gate electrode of the reset transistor 108, the control line TX1 is for supplying a pulse to the gate electrode of the first transfer transistor 104, the control line TX2 is for supplying a pulse to the gate electrode of the second transfer transistor 105, the control line SEL is for supplying a pulse to the gate electrode of the selection transistor 107, and the control line TX3 is for supplying a pulse to the gate electrode of the third transfer transistor 109. OUT denotes a signal line. In FIG. 1, n and m are natural numbers indicating particular rows and columns. More specifically, n indicates an n-th row, (n+1) indicates an (n+1)th row adjacent to the n-th row, m indicates an m-th column, and (m+1) indicates an (m+1)th column adjacent to the (m+1)th column. A signal output via the signal line OUT is held by a reading circuit (not shown) and subjected to a process such as amplification, addition, etc. The resultant signal is output to the outside of the solid-state image pickup apparatus. In this process, a control signal is supplied from a horizontal scanning circuit (not shown) to control the processing such as addition on the signal and the outputting of the signal to the outside. The signal line OUT is connected to an amplifying transistor and a source follower circuit functioning as a constant current source. In FIG. 1, the pixels 100 are basic units forming the photoelectric conversion apparatus, and each pixel includes one photoelectric conversion unit 101.

In the pixels 100 shown in FIG. 1, the global electronic shutter operation is performed as follows. After an accumulation period has been elapsed, the charge produced in the photoelectric conversion unit 101 is transferred to the charge storage unit 102 via the first transfer transistor 104. During a period in which the signal charge accumulated in a certain storage period is stored in the charge storage unit 102, accumulation of a next signal charge in the photoelectric conversion unit 101 is started. The signal charge in the charge storage unit 102 is transferred to the node 103 including the FD part via the second transfer transistor 105 and is output as a signal from the amplifying transistor 106. To prevent the electric charge, produced in the photoelectric conversion unit 101 during the period in which the signal charge is stored in the charge storage unit 102, from intruding into the charge storage unit 102, the electric charge in the photoelectric conversion unit 101 may be discharged via the third transfer transistor 109. The reset transistor 108 sets the node 103 including the FD part to a particular electric potential before the signal charge is transferred from the charge storage unit 102 (this operation is called a reset operation). The electric potential at the node 103 including the FD part at this point of time is output as a noise signal to the signal line OUT via the amplifying transistor 106. Based on the difference between this signal and the signal based on the signal charge output later, it is possible to remove the noise signal.

Figure 2A:
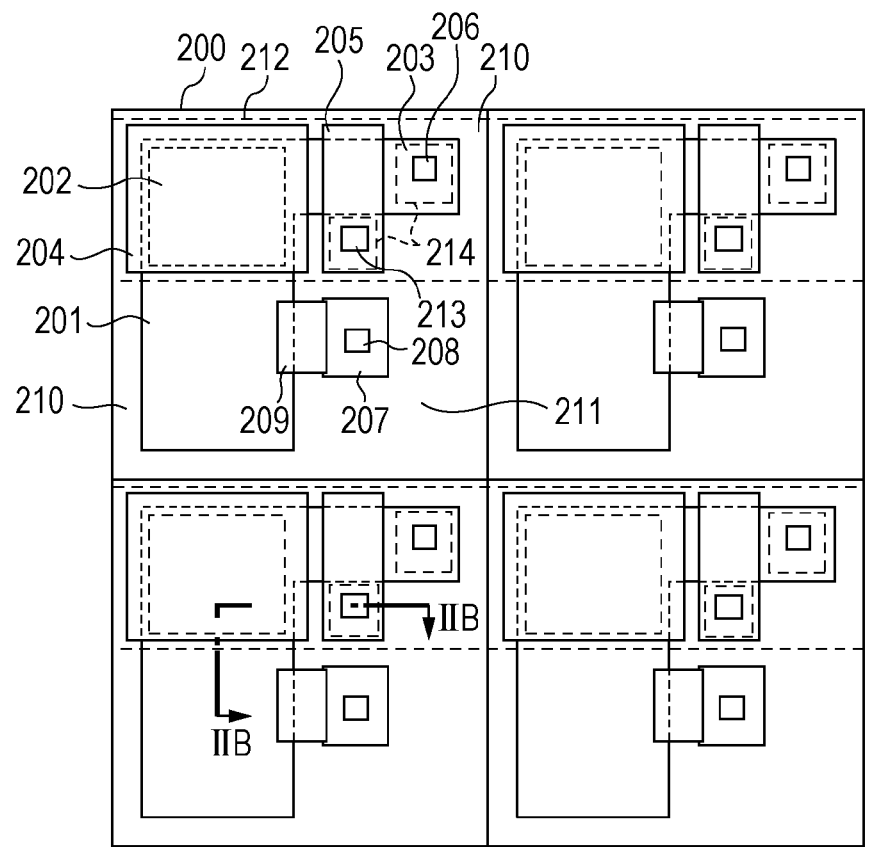
FIG. 2A is a schematic plan view of the solid-state image pickup apparatus according to the first embodiment.
Figure 2B:
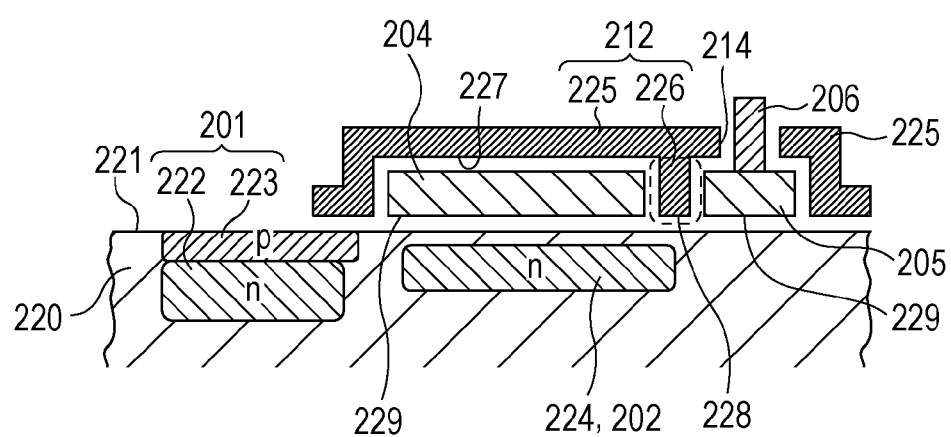
FIG. 2B is a schematic cross-sectional view of the solid-state image pickup apparatus according to the first embodiment.

FIG. 2A is a plan view illustrating a solid-state image pickup apparatus corresponding to the circuit diagram shown in FIG. 1. FIG. 2B is a schematic cross-sectional view of the solid-state image pickup apparatus taken along line IIB-IIB of FIG. 2A. In FIG. 2A and FIG. 2B, some elements such as a wiring layer, an insulating film, etc., disposed at a level higher than the level of the gate electrodes are not shown.

In FIG. 2A, pixels 200 correspond to the pixels 100 shown in FIG. 1 and are arranged in an array with two rows and two columns. In this figure, the pixels 200 are virtually partitioned into rectangular regions. Taking one of the four pixels as an example, the structure of the pixel is described below. The pixel 200 includes a photoelectric conversion unit 201 and a charge storage unit 202 disposed close to each other. A gate electrode 204 of a first transfer transistor for transferring an electric charge is disposed between the photoelectric conversion unit 201 and the charge storage unit 202. In the present embodiment, when seen in plan view, the gate electrode 204 extends such that the charge storage unit 202 is fully covered with the gate electrode 204. By providing the gate electrode 204 such that the charge storage unit 202 is fully covered with the gate electrode 204, it becomes possible to suppress incidence of light on the charge storage unit 202. Furthermore, by controlling a voltage applied to the gate electrode 204 extending over the charge storage unit 202, it is possible to reduce a dark current in the charge storage unit 202. Note that the main electrode regions of the first transfer transistor include the photoelectric conversion unit 201 and the charge storage unit 202. The pixel 200 further includes a gate electrode 205 of a second transfer transistor for transferring the electric charge from the charge storage unit 202, an FD part 203, a gate electrode 209 of a third transfer transistor. A main electrode region 207 is disposed adjacent to the gate electrode 209. The main electrode region 207 is a region in which an unnecessary part of the electric charge generated in the photoelectric conversion unit is discharged. The gate electrode 204 functions as the first gate electrode, and the gate electrode 205 functions as the second gate electrode.

In FIG. 2A, a contact plug 206 is disposed in the FD part 203 to provide a connection between the FD part 203 and a gate electrode of an amplifying transistor and a connection between the FD part 203 and a main electrode region of a reset transistor. A contact plug 208 is disposed in the main electrode region 207 to provide a connection between the main electrode region 207 and a power supply line. A contact plug 213 is disposed on the second gate electrode 205 to provide a connection between the second gate electrode 205 and a control line. The pixel 100 shown in FIG. 1 includes other elements disposed in a region 211 shown in FIG. 2A or FIG. 2B. In the present embodiment and other elements described below, it is assumed that signal charges are electrons and transistors in the pixel 100 shown in FIG. 1 are N-type Metal Oxide Semiconductor (MOS) transistors.

The photoelectric conversion unit 201 includes, at least, an N-type semiconductor region functioning as a charge accumulation unit. The charge storage unit includes an N-type semiconductor region capable of accumulating an electric charge. The FD part includes an N-type semiconductor region. The main electrode region 206 of the third transfer transistor includes an N-type semiconductor region. Each element is disposed in an active region, and an element isolation region 210 is disposed such that the active region is surrounded by the element isolation region 210. The element isolation region 210 has an isolation structure such as STI (Shallow Trench Isolation), LOCOS (Local Oxidation of Silicon), or PN junction isolation.

In FIG. 2A, a light shielding member 212 extends over a plurality of pixels 200. The light shielding member 212 covers the charge storage unit 202 and at least part of the second gate electrode 205. In the present embodiment, the light shielding member 212 covers the charge storage unit 202, the first gate electrode 204, the second gate electrode 205, and part of the element isolation region 210. As in the example shown in FIG. 2A, the light shielding member 212 may further extend over part, on the side of the first gate electrode 204, of the photoelectric conversion unit. The light shielding member 212 includes a plurality of openings 214 for the respective contact plugs. The light shielding member 212 does not exist over a part of the FD part 203 and over a part of the second gate electrode 205. The light shielding member 212 may be disposed such that the light shielding member 212 covers other elements in the pixel other than the photoelectric conversion unit 201 and regions in which contact plugs are disposed. In the structure described above, the gate electrodes 204 and 205 may be formed using a material such as polysilicon, and the light shielding member may be formed using a material such as tungsten, aluminum, etc.

FIG. 2B is a schematic cross-sectional view of the solid-state image pickup apparatus taken along line IIB-IIB of FIG. 2A. In FIG. 2B, In a P-type semiconductor substrate 220 with a surface 221, an N-type semiconductor region 222a of the photoelectric conversion unit 201 shown in FIG. 2A and a P-type semiconductor region 223 are formed such that the P-type semiconductor region 223 is located closer to the surface 221 of the semiconductor substrate 220 than the N-type semiconductor region 222a is located. In the semiconductor substrate 220, an N-type semiconductor region 224 of the charge accumulation unit 202 shown in FIG. 2A is also formed. The first gate electrode 204 and the second gate electrode 205 are disposed on the semiconductor substrate 220. The contact plug 206 for connection to the second gate electrode 205 is disposed on the second gate electrode 205.

In FIG. 2B, the light shielding member 212 shown in FIG. 2A includes a first part 225 covering the first gate electrode 204 and the second gate electrode 205 and further includes a second part 226 disposed between the first gate electrode 204 and the second gate electrode 205. The first part 225 and the second part 226 are formed such that a bottom surface 228 of the second part 226 is located closer to the surface 221 of the semiconductor substrate 220 than a bottom surface 227 of the first part 225 is located. This structure allows a reduction in the amount of light intruding via the opening 214 for disposing the contact plug 206 and a reduction in intruding of the charge generated by the intruding light into the charge storage unit 202 or the photoelectric conversion unit 201.

The locations of the first part 225 and the second part 226 are described in further detail below. The first part 225 covers the first gate electrode 204 and the second gate electrode 205 and extends between the first gate electrode 204 and the second gate electrode 205. The second part 226 is disposed such that when seen from above the surface 221 of the semiconductor substrate 220 to the surface 221 and when the shapes of the respective parts are projected onto the surface 221, the second part 226 is located between the first gate electrode 204 and the second gate electrode 205. Furthermore, in cross section taken perpendicular to the surface 221 of the semiconductor substrate 220, the distance of the bottom surface 228 of the second part 226 from the surface 221 of the semiconductor substrate 220 is the same as the distance of the bottom surface 229 of the first gate electrode 204 and the second gate electrode 205 from the surface 221 of the semiconductor substrate 220. The second part 226 may be disposed to satisfy at least the condition that the bottom surface 228 of the second part 226 is located closer to the surface 221 of the semiconductor substrate 220 than the bottom surface 227 of the first part 225 is located with respect to the surface 221 of the semiconductor substrate 220.

In this structure, the first part 225 and the second part 226 are provided in an integrated form such that the light shielding member 212 extends from the first gate electrode 204 to the second gate electrode 205 thereby covering the region between the first gate electrode 204 and the second gate electrode 205, and such that the light shielding member 212 extends toward the surface of the semiconductor substrate 220 and between the first gate electrode 204 and the second gate electrode 205. Note that in the present embodiment, the upper surface of the first part 225 and the upper surface of the second part 226 are substantially flat. If the upper surfaces thereof are not flat, light reflected at the upper surfaces may become stray light, which may affect the light shielding performance in some region. In this regard, the upper surfaces being flat are advantageous.

When the thickness of light shielding member is denoted by D1 and the distance between the first gate electrode 204 and the second gate electrode 205 is denoted by D2, it is desirable to set D1 and D2 such that $3 \times D1 \geq D2 \geq 1 \times D1$ to achieve good electrical insulation between the first gate electrode 204 and the second gate electrode 205 and good light shielding performance of the light shielding member 212. If the distance D2 is too small, there is a possibility that the light shielding member formed does not extend downward a sufficient distance, which may cause a reduction in the effect of the light shielding member in terms of the electric field. Conversely, if the distance D2 is too large, there is a possibility that there is a region that is not reached by the electric field extending from the first gate electrode 204 or the second gate electrode 205, which may cause an increase in dark current and/or a reduction in transfer efficiency.

In FIG. 2B, the light shielding member 212 is disposed such that it is located at the same height as the height of the contact plug 206 (not shown) disposed in the FD part 203 and such that the light shielding member 212 is located below a metal wiring layer (not shown). By disposing the light shielding member 212 at a location closer to the surface 221 of the semiconductor substrate 220 than the wiring layer is located with respect to the surface 221 of the semiconductor substrate 220, it is possible to improve the light shielding performance.

The second part 226 shown in FIG. 2B may be formed in a manner described below. After the first gate electrode 204 and the second gate electrode 205 are formed, an insulating film such as a silicon dioxide film is formed such that the insulating film covers the first gate electrode 204 and the second gate electrode 205 and such that the insulating film has a shape corresponding to the shapes of the first gate electrode 204 and the second gate electrode 205. Because the insulating film is formed to have the shape corresponding to the shapes of the first gate electrode 204 and the second gate electrode 205, the surface of the insulating film has a depression. Thereafter, a metal film that is to function as the light shielding member is formed on the insulating film such that the depression of the insulating film is filled with the metal film. The metal film is then etched such that the metal film is removed except for a particular part that is to function as the light shielding member 212.

Figure 3A:
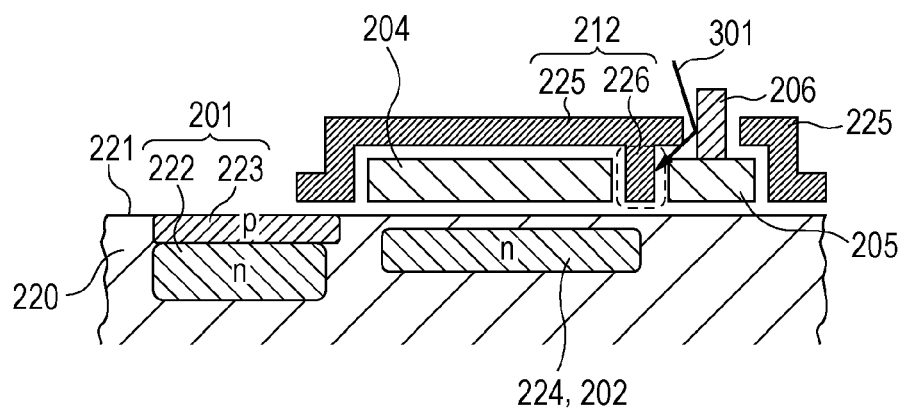
FIG. 3A is a schematic cross-sectional view for use in illustrating the solid-state image pickup apparatus according to the first embodiment.

Next, referring to FIG. 3A and FIG. 3B, the structure according to the present embodiment is further described below. FIG. 3A is a schematic cross-sectional view illustrating the solid-state image pickup apparatus shown in FIG. 2B according to the present embodiment, and FIG. 3B is a schematic cross-sectional view illustrating a solid-state image pickup apparatus with a structure having no second part 226, provided for the purpose of comparison.

Figure 3B:
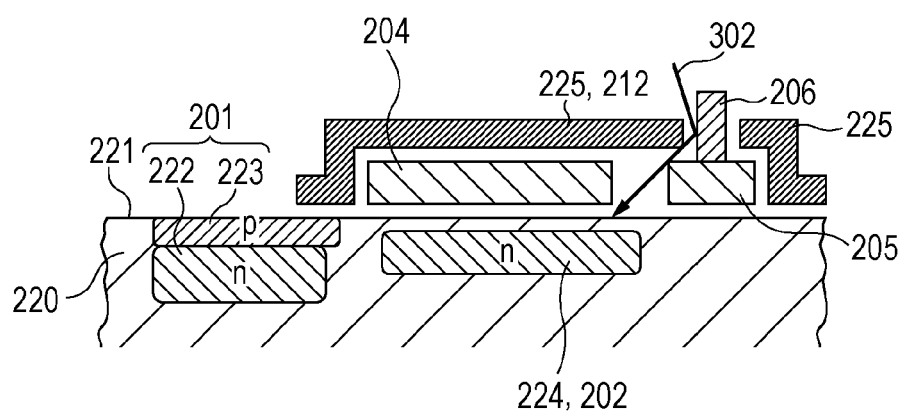
FIG. 3B is a schematic cross-sectional view for use in illustrating the solid-state image pickup apparatus according to the first embodiment.

In both FIG. 3A and FIG. 3B, behavior of light is illustrated for a case where light is incident at an angle on the opening 214 of the light shielding member 212. In the structure shown in FIG. 3B, light 302 is easily incident on elements such as the charge storage unit 202. Even when light 302 is incident on no element, incidence of light 302 on the semiconductor substrate 220 may generate an electric charge which may intrude into the charge storage unit 202 or the photoelectric conversion unit 201. The intrusion of the electric charge into the charge storage unit 202 or the photoelectric conversion unit 201 results in noise in the image signal. On the other hand, in the structure shown in FIG. 3A, the presence of the second part 226 results in a reduction in the amount of light 301 onto the semiconductor substrate 301.

In the present embodiment, the light shielding member 212 covers the charge storage unit 202, the first gate electrode 204, and the second gate electrode 205. More specifically, the light shielding member 212 extends over the whole areas of the above-described elements except for contact plugs thereof. Note that the light shielding member 212 may be formed such that at least a part, on the side of the charge storage unit 202, of the first gate electrode 204 or the second gate electrode 205 is covered by the light shielding member 212. If the light shielding member 212 is disposed such that it extends only over the charge storage unit 202, the charge storage unit 202 are not completely covered by the light shielding member 212 and more particularly an edge thereof facing the first gate electrode or an edge thereof facing the second gate electrode 205 is no covered by the light shielding member 212. By providing the light shielding member 212 such that the gate electrodes are covered at least partially by the light shielding member 212, it is possible to completely cover the charge storage unit 202 by the light shielding member 212. However, even in this structure, there is a possibility that intrusion of light may occur as in the structure shown in FIG. 3B. Such a possibility may be reduced by providing the second part 226 as shown in FIG. 3A.

In the solid-state image pickup apparatus according to the present embodiment, as described above, oblique incidence of light on the charge storage unit is suppressed and thus an improvement in the light shielding performance is achieved. Although in the present embodiment, there is no contact plug for connecting the first gate electrode to the control line, an opening similar to the opening 214 may be formed in the light shielding member 212 and a contact plug for this purpose may be disposed in the opening. Alternatively, the first gate electrode may extend into a region in an adjacent pixel and a contact plug may be disposed in this region.

Second Embodiment

Figure 4A:
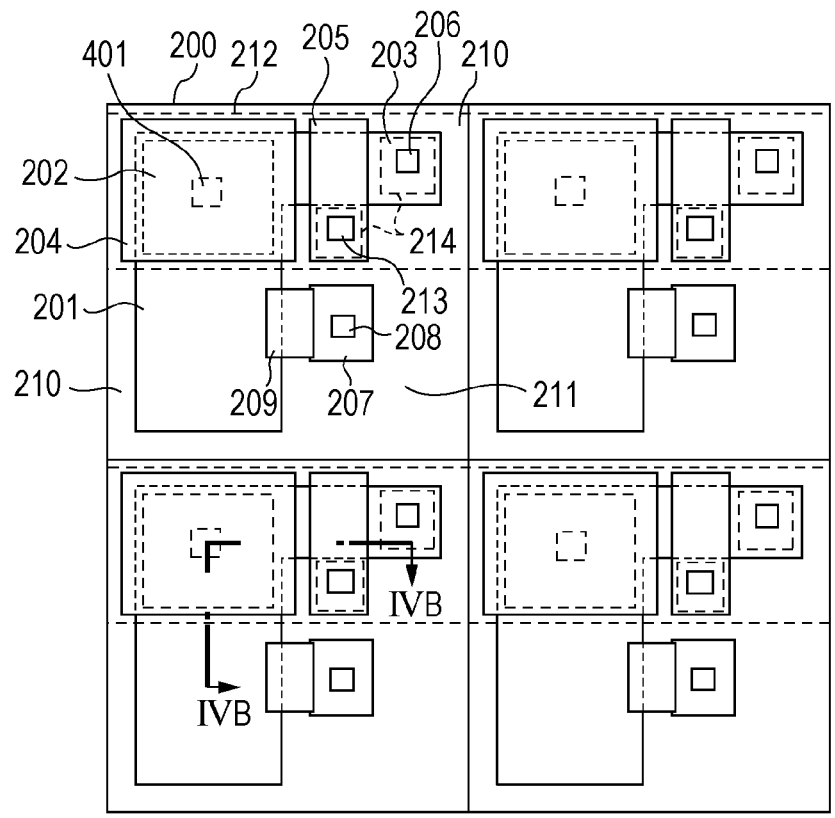
FIG. 4A is a schematic plan view of a solid-state image pickup apparatus according to a second embodiment.
Figure 4B:
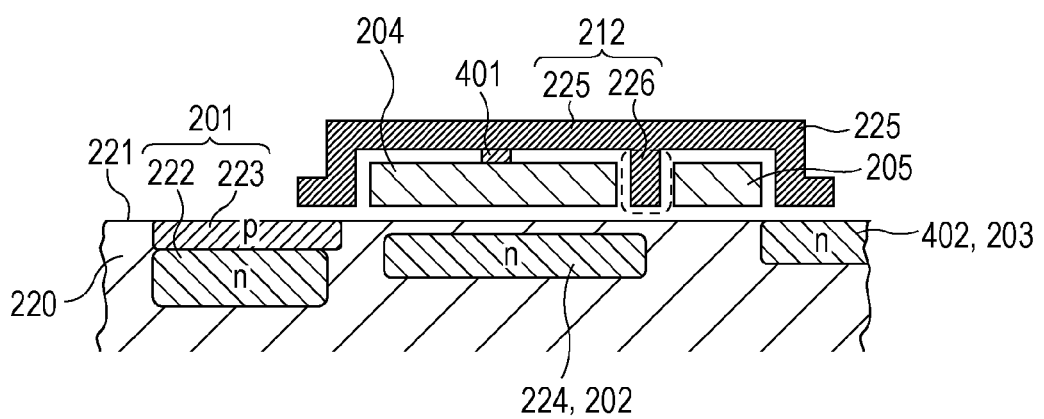
FIG. 4B is a schematic cross-sectional view of the solid-state image pickup apparatus according to the second embodiment.

A solid-state image pickup apparatus according to a second embodiment is described below with reference to FIG. 4A and FIG. 4B. FIG. 4A is a schematic plan view of the solid-state image pickup apparatus, and FIG. 4B is a schematic cross-sectional view of the solid-state image pickup apparatus taken along line IVB-IVB of FIG. 4A. FIG. 4A and FIG. 4B correspond to FIGS. 2A and 2B, respectively, and similar elements to those in FIG. 2A or FIG. 2B are denoted by similar reference symbols, and a further description thereof is omitted.

The structure shown in FIG. 4A is different from that according to the first embodiment in that it has a contact plug 401. The contact plug 401 is provided for electrically connecting the light shielding member 212 to the first gate electrode 204. In this structure, it is not necessary to produce an opening for the contact plug in the light shielding member 212, and thus it is possible to achieve high light shielding performance. Furthermore, in this structure, the light shielding member 212 may also function as a control line for supplying a voltage to the first gate electrode 204, which allows a reduction in the number of wirings.

As shown in FIG. 4B, the contact plug 401 is disposed between the first gate electrode 204 and the first part 225 of the light shielding member 212. An insulating film made of, for example, silicon dioxide is disposed between the first gate electrode 204 and the first part 225. A contact hole is formed in this insulating film and the contact hole is filled with an electrically conductive material thereby forming the contact plug 401. Alternatively, after the contact hole is formed in the insulating film, a metal film that is to function as the light shielding member 212 may be formed thereby simultaneously forming the contact plug 401 and the light shielding member 212. The process of forming these elements is accomplished using common semiconductor fabrication technology, and thus a further detailed description thereof is omitted.

As shown in FIG. 4B, the light shielding member 212 also includes the second part 226 which brings about an improvement in light shielding performance. Note that an N-type semiconductor region 402 shown in FIG. 4B forms an FD region 203 shown in FIG. 4A.

In the solid-state image pickup apparatus according to the present embodiment, as described above, oblique incidence of light on the charge storage unit is suppressed and thus an improvement in the light shielding performance is achieved. Furthermore, the connection between the light shielding member and the first gate electrode allows a reduction in the number of openings, for the contact plugs on the first gate electrode, in the light shielding member, which brings about an improvement in light shielding performance.

Third Embodiment

Figure 5A:
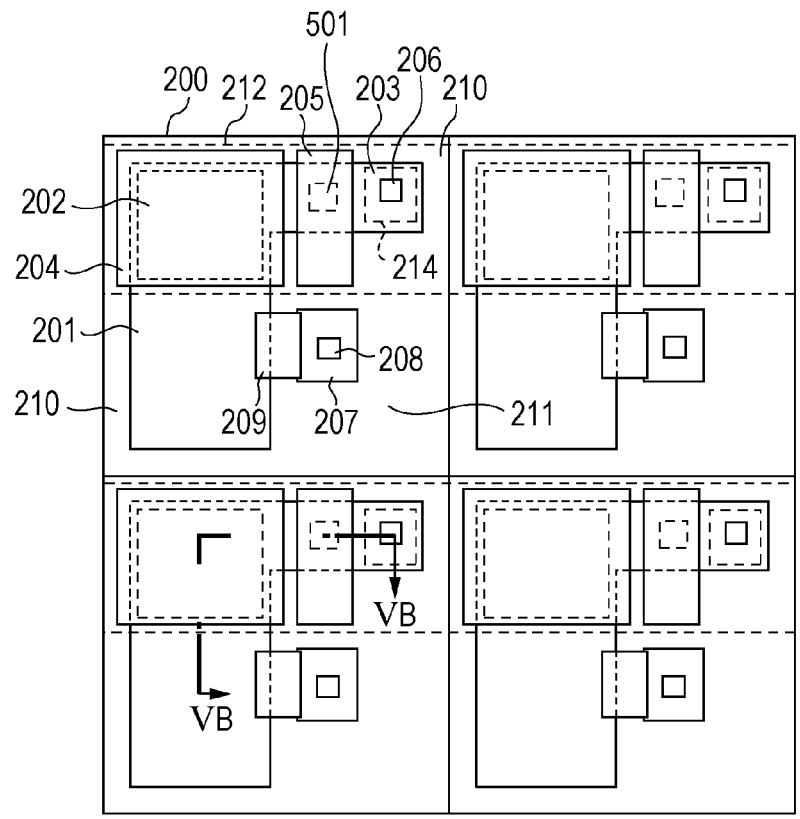
FIG. 5A is a schematic plan view of a solid-state image pickup apparatus according to a third embodiment.
Figure 5B:
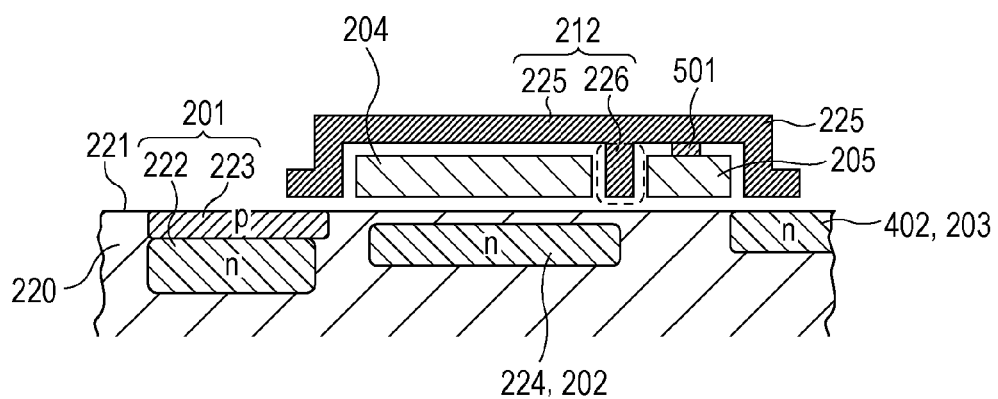
FIG. 5B is a schematic cross-sectional view of the solid-state image pickup apparatus according to the third embodiment.

A solid-state image pickup apparatus according to a third embodiment is described below with reference to FIG. 5A and FIG. 5B. FIG. 5A is a schematic plan view of the solid-state image pickup apparatus, and FIG. 5B is a schematic cross-sectional view of the solid-state image pickup apparatus taken along line VB-VB of FIG. 5A. FIG. 5A and FIG. 5B respectively correspond to FIGS. 2A and 2B, and also to FIG.

4A and FIG. 4B, and similar elements to those in FIG. 2A or FIG. 2B or FIG. 4A or FIG. 4B are denoted by similar reference symbols, and a further description thereof is omitted.

The structure shown in FIG. 5A is different from that according to the second embodiment in that it has not the contact plug 401 shown in FIG. 4A but a contact plug 501. The contact plug 501 is provided for electrically connecting the light shielding member 212 to the second gate electrode 205. In this structure, it is not necessary to produce an opening for the contact plug in the light shielding member 212, and thus it is possible to achieve high light shielding performance. Furthermore, in this structure, the light shielding member 212 may also function as a control line for supplying a voltage to the second gate electrode 205, which allows a reduction in the number of wirings.

As shown in FIG. 5B, the contact plug 501 is, as with the contact plug 401 according to the second embodiment, is formed in an insulating film disposed between the second gate electrode 205 and the first part 225 of the light shielding member 212. This structure is similar to that associated with the contact plug 401 according to the second embodiment, and thus a further detailed description thereof is omitted.

As shown in FIG. 5B, the light shielding member 212 also includes the second part 226 which brings about an improvement in light shielding performance. In the solid-state image pickup apparatus according to the present embodiment, as described above, oblique incidence of light on the charge storage unit is suppressed and thus an improvement in the light shielding performance is achieved. Furthermore, the connection between the light shielding member and the second gate electrode allows a reduction in the number of openings for contact plugs in the light shielding member, which brings about an improvement in light shielding performance.

Fourth Embodiment

Figure 6A:
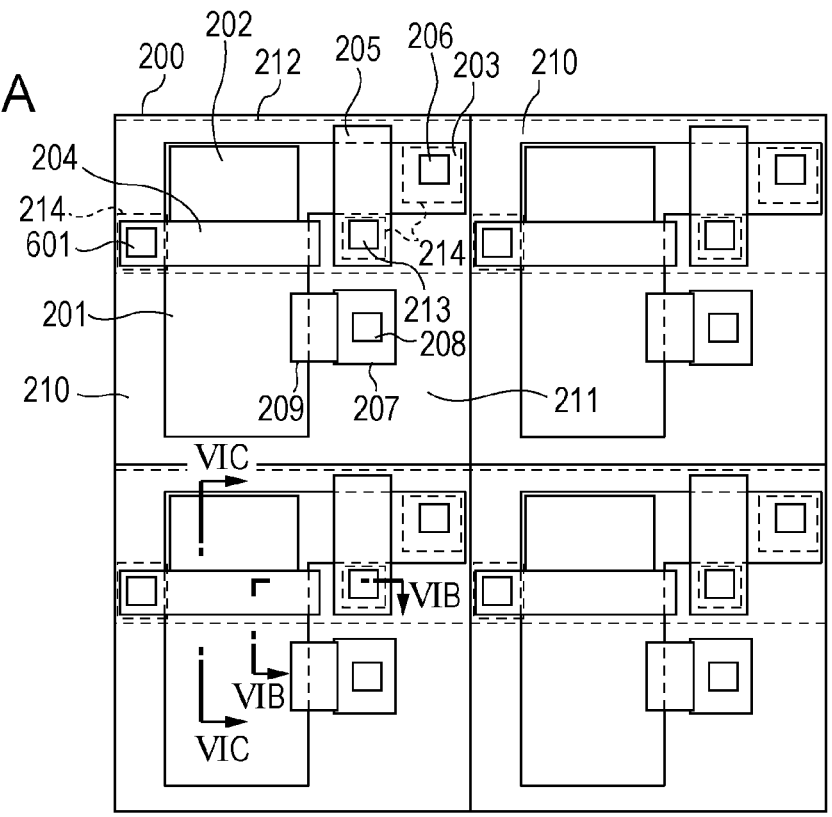
FIG. 6A is a schematic plan view of a solid-state image pickup apparatus according to a fourth embodiment.
Figure 6B:
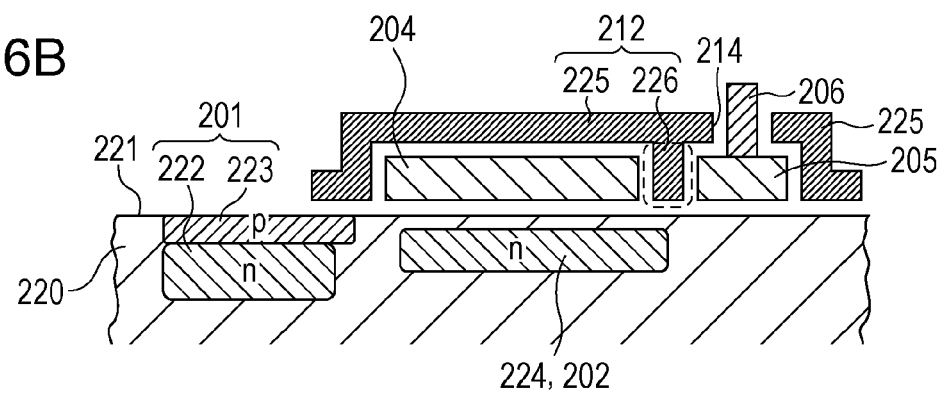
FIG. 6B is a schematic cross-sectional view of the solid-state image pickup apparatus according to the fourth embodiment.
Figure 6C:
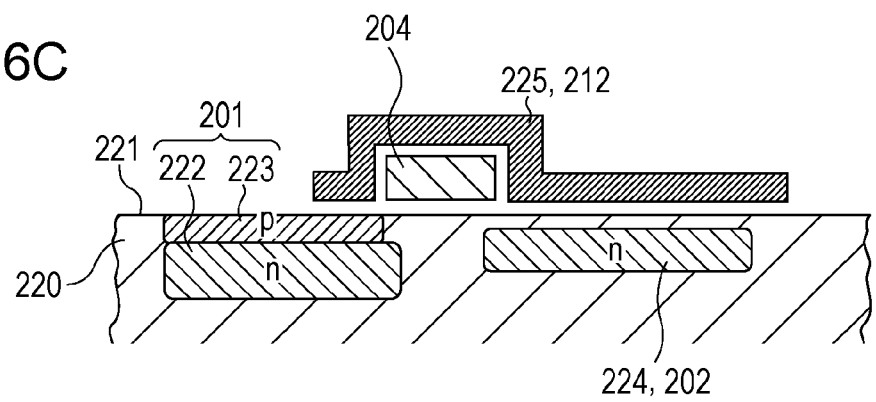
FIG. 6C is a schematic cross-sectional view of the solid-state image pickup apparatus according to the fourth embodiment.

A solid-state image pickup apparatus according to a fourth embodiment is described below with reference to FIGS. 6A to 6C. FIG. 6A is a schematic plan view of the solid-state image pickup apparatus, FIG. 6B is a schematic cross-sectional view of the solid-state image pickup apparatus taken along line VIB-VIB of FIG. 6A, and FIG. 6C is a schematic cross-sectional view of the solid-state image pickup apparatus taken along line VIC-VIC of FIG. 6A. FIG. 6A corresponds to FIG. 2A. FIG. 6B and FIG. 6C correspond to FIG. 2B. In FIGS. 6A to 6C, similar elements to those in FIG. 2A or FIG. 2B are denoted by similar reference symbols, and a further description thereof is omitted.

As shown in FIG. 6A and FIG. 6C, the present embodiment is different from the first embodiment in that the first gate electrode 204 does not cover completely over the whole area of the charge storage unit 202. That is, the first gate electrode 204 extends over part of the N-type semiconductor region 222 and part of the N-type semiconductor region 224. In this structure, the light shielding member 212 is disposed over the charge storage unit 202 and over at least part of the second gate electrode 205. The light shielding member 212 further extends over the first gate electrode 204 and over part of the element isolation region 210. The light shielding member 212 covers the first gate electrode 204 and part, on the side of the first gate electrode 204, of the photoelectric conversion unit 201.

Also in this structure, as shown in FIG. 6B, the light shielding member 212 further includes a second part 226 disposed between the first gate electrode 204 and the second gate electrode 205. The presence of the second part 226 results in a suppression of oblique incidence of light on the charge storage unit, and thus an improvement in the light shielding performance is achieved. In FIG. 6A, reference numeral 601 denotes a contact plug that is disposed on the first gate electrode 204 such that it is in contact with the first gate electrode 204 and that is for supplying a voltage to the first gate electrode 204.

The solid-state image pickup apparatus according to any one of the embodiments described above may be applied to, for example, an image pickup system including the solid-state image pickup apparatus as described below. Note that the term "image pickup system" is used to describe a wide variety of systems including an apparatus whose main purpose is to take an image such as a still camera, a video camera, etc., and an apparatus having an image-taking function as an auxiliary function such as a personal computer, a portable terminal, etc. The image pickup system includes a solid-state image pickup apparatus according to one of the embodiments described above and a processing unit that processes a signal output from the solid-state image pickup apparatus. The processing unit may include, for example, a digital data processor.

In the solid-state image pickup apparatus according to the present embodiment, as described above, oblique incidence of light is suppressed and thus an improvement in the light shielding performance is achieved. Thus, a reduction in intrusion of noise into an image signal is achieved, and thus a high-quality image may be obtained.

The solid-state image pickup apparatus is not limited to the embodiments described above, but various modifications are possible. For example, conduction types of the transistors and the semiconductor regions may be inverted, and/or transistors of different conduction types may be combined. Note that techniques disclosed in the embodiments described above may be combined.

While the disclosure has been described with reference to exemplary embodiments, it is to be understood that embodiments are not limited to the disclosed exemplary embodiments. The scope of the following claims is to be accorded the broadest interpretation so as to encompass all such modifications and equivalent structures and functions.

This application claims the benefit of Japanese Patent Application No. 2011-119258 filed May 27, 2011, which is hereby incorporated by reference herein in its entirety.

What is claimed is:
1. A solid-state image pickup apparatus comprising:
   a semiconductor substrate;
   a photoelectric conversion unit disposed on the semiconductor substrate;
   a charge storage unit that is disposed on the semiconductor substrate and that stores an electric charge generated in the photoelectric conversion unit;
   a floating diffusion unit which is disposed on the semiconductor substrate and to which the electric charge stored in the charge storage unit is transferred;
   a first gate electrode disposed on the semiconductor substrate, disposed between the photoelectric conversion unit and the charge storage unit, and disposed over the charge storage unit;
   a second gate electrode disposed on the semiconductor substrate, disposed between the charge storage unit and the floating diffusion unit; and
   a light shielding member including a first part and a second part wherein the first part is disposed over the charge storage unit and disposed over at least one of the first gate electrode and the second gate electrode, and wherein the second part is disposed between the first gate electrode and the second gate electrode such that the second part extends from the first part toward a surface of the semiconductor substrate.

2. The solid-state image pickup apparatus according to claim 1, further comprising a plug disposed on the second gate electrode and configured to supply a voltage to the second gate electrode,
wherein the light shielding member includes an opening surrounding the plug.

3. The solid-state image pickup apparatus according to claim 1, wherein when the thickness of the light shielding member is denoted by D1 and the distance between the first gate electrode and the second gate electrode is denoted by D2, D2 and D1 satisfy a condition described below:

$$3 \times D1 \geq D2 \geq 1 \times D1.$$

4. The solid-state image pickup apparatus according to claim 1, wherein the light shielding member extends over part, on a side of the first gate electrode, of the photoelectric conversion unit.

5. The solid-state image pickup apparatus according to claim 1, further comprising a plug functioning as a contact connecting the first gate electrode to the light shielding member.

6. The solid-state image pickup apparatus according to claim 1, further comprising a plug functioning as a contact connecting the second gate electrode to the light shielding member.

7. The solid-state image pickup apparatus according to claim 1, further comprising a plurality of wiring layers,
wherein the light shielding member is located closer to the semiconductor substrate than the wiring layers are located with respect to the semiconductor substrate.

8. The solid-state image pickup apparatus according to claim 1, wherein an upper surface of the first part and an upper surface of the second part are substantially flat.

9. An image pickup system comprising:
the solid-state image pickup apparatus according to claim 1, and
a processing unit that processes a signal output from the solid-state image pickup apparatus.

10. The solid-state image pickup apparatus according to claim 1, wherein a bottom surface of the second part is located closer to a surface of the semiconductor substrate than a bottom surface of the first part.

11. The solid-state image pickup apparatus according to claim 10, wherein the bottom surface of the second part is located closer to the surface of the semiconductor substrate than at least one of upper surfaces of the first and second gate electrodes.

12. A solid-state image pickup apparatus comprising:
a semiconductor substrate having a photoelectric conversion unit, a floating diffusion unit, and a charge storage unit disposed between the photoelectric conversion unit and the floating diffusion unit;
a first gate electrode disposed on the semiconductor substrate, disposed between the photoelectric conversion unit and the charge storage unit, and disposed over the charge storage unit;
a second gate electrode disposed on the semiconductor substrate, disposed between the charge storage unit and the floating diffusion unit; and
a light shielding member including a first part and a second part, wherein the first part is disposed over the charge storage unit and is disposed over at least one of the first gate electrode and the second gate electrode, wherein the second part is disposed between the first gate electrode and the second gate electrode, and wherein a bottom surface of the second part is located closer to a surface of the semiconductor substrate than a bottom surface of the first part.

13. The solid-state image pickup apparatus according to claim 12, wherein the bottom surface of the second part is located closer to the surface of the semiconductor substrate than at least one of upper surfaces of the first and second gate electrodes.

14. An image pickup system comprising:
the solid-state image pickup apparatus according to claim 12, and
a processing unit that processes a signal output from the solid-state image pickup apparatus.

15. A solid-state image pickup apparatus comprising:
a semiconductor substrate having a photoelectric conversion unit, a floating diffusion unit, and a charge storage unit disposed between the photoelectric conversion unit and the floating diffusion unit;
a first gate electrode disposed on the semiconductor substrate, disposed between the photoelectric conversion unit and the charge storage unit, and disposed over the charge storage unit;
a second gate electrode disposed on the semiconductor substrate, disposed between the charge storage unit and the floating diffusion unit; and
a light shielding member disposed between the first gate electrode and the second gate electrode, disposed over at least one of the first gate electrode and the second gate electrode, and having a bottom surface, wherein a part of the bottom surface disposed between the first gate electrode and the second gate electrode is located closer to a surface of the semiconductor substrate than the other part of the bottom surface.

16. The solid-state image pickup apparatus according to claim 15, wherein the part of the bottom surface is located closer to the surface of the semiconductor substrate than at least one of upper surfaces of the first and second gate electrodes.

17. An image pickup system comprising:
the solid-state image pickup apparatus according to claim 15, and
a processing unit that processes a signal output from the solid-state image pickup apparatus.

* * * * *